United States Patent [19]
Lian et al.

[11] Patent Number: 5,825,290
[45] Date of Patent: Oct. 20, 1998

[54] ACTIVE ELEMENT FOR MAGNETOMECHANICAL EAS MARKER INCORPORATING PARTICLES OF BIAS MATERIAL

[75] Inventors: Ming-Ren Lian, Boca Raton, Fla.;
Robert C. O'Handley, Andover, Mass.

[73] Assignee: Sensormatic Electronics Corporation, Boca Raton, Fla.

[21] Appl. No.: 800,772

[22] Filed: Feb. 14, 1997

[51] Int. Cl.$^6$ .................................................. G08B 13/14
[52] U.S. Cl. .................. 340/572; 340/551; 146/108; 146/121; 146/122; 148/307; 148/308; 148/311
[58] Field of Search .................................. 340/572, 551; 148/121, 122, 108, 306, 310, 307, 308, 311, 603; 360/126

[56] References Cited

U.S. PATENT DOCUMENTS

| | | | |
|---|---|---|---|
| 4,510,489 | 4/1985 | Anderson et al. | 340/572 |
| 4,645,339 | 2/1987 | Yamauchi et al. | 340/551 |
| 5,252,144 | 10/1993 | Martis | 148/121 |
| 5,469,140 | 11/1995 | Liu et al. | 340/551 |
| 5,565,849 | 10/1996 | Ho et al. | 340/572 |
| 5,568,125 | 10/1996 | Liu | 340/551 |
| 5,663,857 | 9/1997 | Kumura et al. | 360/126 |

OTHER PUBLICATIONS

G. Herzer, "Grain Size Dependence of Coercivity and Permeability in Nanocrystalline Ferromagnets", *IEEE Transactions on Magnetics*, vol. 26, No. 5, Sep. 1990, pp. 1397–1402.

R.C. O'Handley, et al., "Magnetization process in devitrified glassy alloy", *J. Appl. Phys.* 57 (1), 15 Apr. 1985, pp. 3563–3565.

*Primary Examiner*—Jeffery A. Hofsass
*Assistant Examiner*—Benjamin C. Lee
*Attorney, Agent, or Firm*—Robin, Blecker & Daley

[57] ABSTRACT

A self-biasing magnetostrictive element for use in a magnetomechanical EAS marker is a strip of amorphous alloy with crystalline particles of semi-hard or hard magnetic material distributed throughout the bulk of the amorphous alloy strip. The crystalline particles are magnetized to bias the amorphous alloy strip to resonate in response to an interrogation signal. The crystalline particles are formed by heat-treating the amorphous alloy strip at a temperature above the Curie temperature of the amorphous alloy in the presence of a longitudinal magnetic field. The alloy strip is then cross-field annealed at a temperature below the Curie temperature of the amorphous alloy to form a transverse anisotropy in the amorphous bulk of the alloy strip. A preferred alloy composition includes iron, cobalt, niobium, copper, boron and silicon.

32 Claims, 4 Drawing Sheets

ACTIVE ELEMENT FOR MAGNETOMECHANICAL EAS MARKER INCORPORATING PARTICLES OF BIAS MATERIAL

FIELD OF THE INVENTION

This invention relates to a marker for use in electronic article surveillance (EAS) systems, and, in particular, to magnetic markers of the type which comprise magnetostrictive materials.

BACKGROUND OF THE INVENTION

U.S. Pat. No. 4,510,489, issued to Anderson et al., discloses a magnetomechanical marker formed from a magnetostrictive ferromagnetic element or strip. The magnetostrictive element is sometimes referred to as the "active" element. Disposed adjacent to the magnetostrictive element is a further element, sometimes referred to as the "bias" or "control" element, which is composed of a hard or semi-hard magnetic material. Arming or activating the magnetostrictive element is accomplished by magnetizing the ferromagnetic biasing element, thereby causing a DC magnetic field to be placed along the magnetostrictive element.

As described in the '489 patent, when the magnetostrictive element is biased by the DC magnetic field, subsequent application of an AC magnetic field to the magnetostrictive element causes the element to store energy mechanically and magnetically, via magnetostriction or magnetomechanical coupling. The energy is alternately stored and released at the frequency of the applied AC field.

According to one embodiment disclosed in the Anderson et al. patent, the interrogation signal is turned on and off, or "pulsed", and a "ring-down" signal generated by the active element after conclusion of each interrogation signal pulse is detected.

Magnetomechanical markers can be deactivated by degaussing the control element, so that the bias field is removed from the active element thereby causing a substantial shift in the resonant frequency of the active element and a substantial reduction in the amplitude of the ring-down signal.

EAS systems which detect the presence of magnetomechanical markers using a pulsed-field interrogation signal are marketed by the assignee of the present application under the trademark ULTRA*MAX and are in widespread use.

The disclosure of the '489 patent is incorporated herein by reference.

U.S. Pat. No. 5,565,849 (which has a common inventor and assignee with the present application) discloses a "self-biasing" magnetostrictive element for a magnetomechanical EAS marker. According to the '849 patent, the magnetostrictive element is processed so as to form a sequence of magnetic domains with respective anisotropies that are canted from a transverse direction toward one of the ends of the element. The canted domains provide a remanent magnetization along the longitudinal axis of the active element so that the element provides its own bias field, and no separate bias or control element is required.

A magnetomechanical marker which includes a self-biasing active element can be produced at lower cost than conventional markers both because the bias element is eliminated, and because the housing structure for the marker can be simplified. However, the process required to form canted-anisotropy domains in the active element, as provided in the '849 patent, cannot always be carried out so as to produce a fixed level of bias field. Variations in bias field level tend to cause variations in the resonant frequency of the active element, which may make it difficult for the marker to be detected by pulsed-field detection equipment operating at a standard operating frequency. In addition, the level of ring-down output signal provided by the canted-anisotropy self-biased active element is not always as high as may be desired.

OBJECTS AND SUMMARY OF THE INVENTION

It is primary object of the present invention to provide a magnetomechanical marker which avoids the need to use a separate biasing element.

It is a further object of the invention to provide a self-biased magnetostrictive element that produces a high-amplitude ring-down signal upon termination of an interrogation signal pulse.

According to an aspect of the invention, there is provided a magnetostrictive element for use in a magnetomechanical electronic article surveillance marker, in the form of a strip of amorphous magnetically soft metal alloy, including particles of semi-hard or hard magnetic material distributed throughout the bulk of the alloy strip.

According to a preferred embodiment of the invention, the particles of semi-hard or hard material are crystals formed in the alloy strip by heat-treating the alloy strip, and each particle consists of a single magnetic domain. The crystalline particles are magnetized to provide a bias field for the magnetostrictive element and preferably have a coercivity of at least 20 Oe. The alloy strip may be formed of an alloy including iron, cobalt, niobium, copper, boron and silicon. In a preferred range of compositions, copper, boron and silicon make up 1%, 15% and 6%, respectively, of the alloy, and the other elements in the alloy are in the following ranges: iron—45% to 72%, cobalt—4% to 30% and niobium—2% to 6%.

According to another aspect of the invention, there is provided a method of fabricating a marker for use in a magnetomechanical electronic article surveillance system, including the steps of first annealing a strip of amorphous magnetostrictive metal alloy having length and width extent during application of a first magnetic field directed along the length of the alloy strip, and subsequent to the first annealing, second annealing the alloy strip during application of a second magnetic field directed transverse to the length of the alloy strip to form a transverse anisotropy in the alloy strip. The first annealing step is preferably for forming a first magnetic structure in the alloy strip and the second annealing step is performed so as not to substantially change the first magnetic structure. It is preferred that the first annealing step be performed at a higher temperature than the second annealing step, with the first step being performed at a temperature above the Curie temperature of the amorphous alloy and the second annealing step performed at a temperature below the Curie temperature. More particularly, the first step is for forming crystalline particles of semi-hard or hard magnetic material from the amorphous alloy, the particles being distributed throughout the bulk of the alloy strip and each consisting of a single magnetic domain and having an anisotropy oriented by the field applied in the longitudinal direction of the alloy strip during the annealing. The effect of the first annealing step is to form the crystalline particles and set the magnetization in a direction substantially parallel to the length of the strip to provide a magnetic bias for the alloy strip. The effect of the second annealing step is to form a transverse anisotropy in the amorphous bulk of the alloy strip, without substantially affecting the state of magnetization of the crystalline bias particles.

DESCRIPTION OF PREFERRED EMBODIMENTS AND PRACTICES

Figure 1:
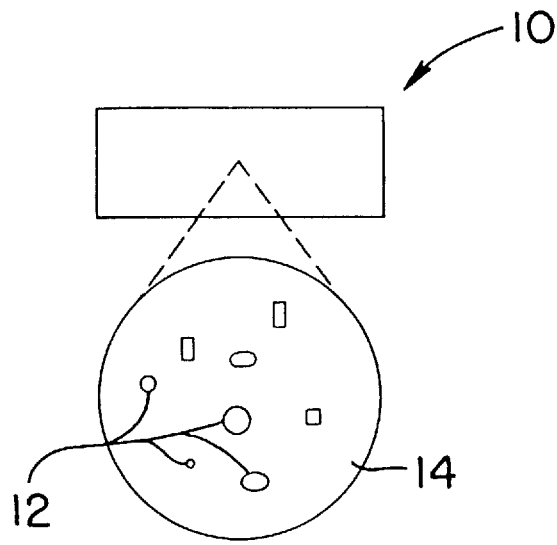
FIG. 1 is a plan view of a self-biased magnetostrictive element provided in accordance with the invention, with a portion of the bulk of the magnetostrictive element schematically represented in magnified form to illustrate the presence of crystalline bias particles distributed within the amorphous matrix which makes up the bulk of the magnetostrictive element.

FIG. 1 shows a plan view of a magnetostrictive element 10 provided in accordance with the invention. The element 10 is similar in geometry to conventional active elements for magnetomechanical markers in that the element 10 is in the form of a thin strip of metal alloy, with a thickness of about 25 microns, a width of about 6 to 13 millimeters, and a length of about 35–40 millimeters. As seen from the enlarged pictorial representation of the structure of the element 10, small crystalline particles 12 of a semi-hard or hard magnetic material are distributed throughout the amorphous alloy matrix 14 which makes up the bulk of the magnetostrictive element 10. Each of the particles 12 is formed, according to the invention, as a crystal nucleated within the amorphous matrix of the element 10 by heat treatment of the element 10. Each of the particles 12 is small enough so that it constitutes a single-domain particle that is free of any domain walls. The heat treatment by which the crystalline particles 12 are formed is accompanied by application of a DC magnetic field to the element 10 so that the crystalline particles 12 have an anisotropy in the direction of the applied field, and so that the particles are magnetized in the direction of the applied field.

Figure 2A:
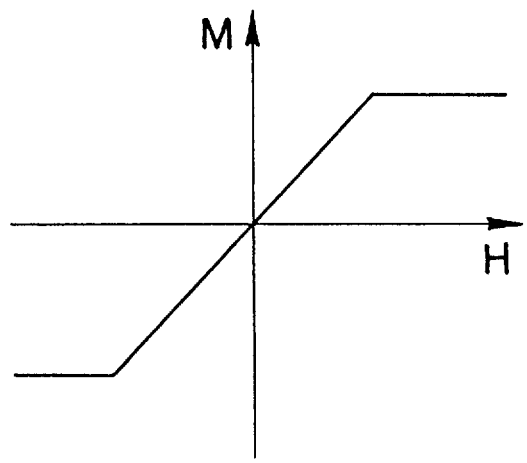
FIGS. 2A and 2B represent M-H loops of the active element of FIG. 1, with the bias particles in a demagnetized and magnetized condition, respectively.
Figure 2B:
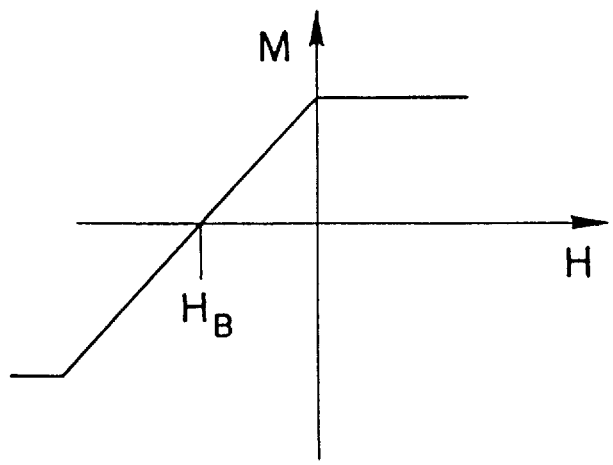

When magnetized, the particles 12 together provide the magnetic bias required to set the resonant frequency of the active element 10 at a predetermined operating frequency of EAS detection equipment. When the particles are not magnetized, the element 10 exhibits an M-H loop as shown in FIG. 2A. When the bias elements are magnetized to saturation, preferably along the length of the element 10, the bias particles 12 provide an effective magnetic bias $H_B$, which shifts the M-H loop of the article 10 as shown in FIG. 2B.

To meet the requirement that the crystalline particles 12 consist of only a single magnetic domain, it is necessary that the particles not exceed the critical radius $r_c$, for single-domain behavior. The critical radius $r_c$, is calculated according to the following equation:

$$r_c = \pi \sqrt{\frac{3A}{4\pi M_S^2}} \quad (1)$$

In this expression, A represents the exchange stiffness of the crystal material of the particles 12, and $M_s$ is the saturation magnetization of the particles. Preferably the amorphous matrix and the crystalline particles both exhibit a magnetization such that $4\pi M_s$ is about 10 kG, and the exchange stiffness of both the amorphous matrix and the particles is about $10^{-6}$ erg/cm. A preferred anisotropy field $H_a$ for the amorphous matrix after transverse annealing is about 15 Oe. For the crystalline particles, a suitable range of values for $K_u$ (anisotropy constant) is about $5\times10^4$ to $1\times10^6$ erg/cm$^3$, such that the anisotropy field $H_a$ of the particles will fall into the range of 20 Oe to 100 Oe.

Figure 3:
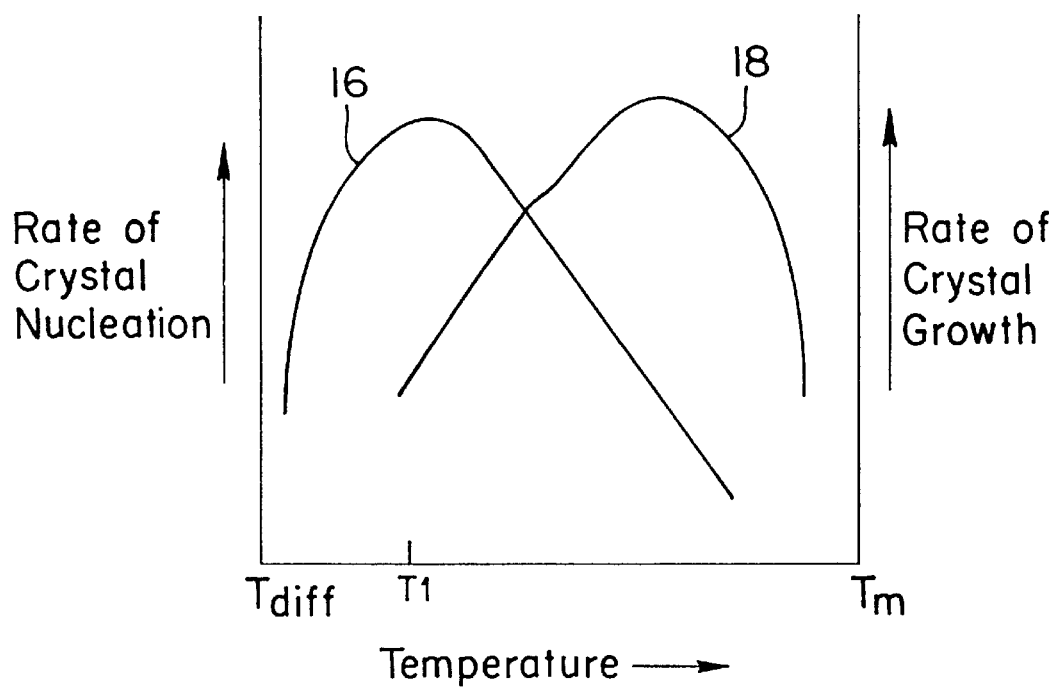
FIG. 3 is a graphical presentation of the rates of crystal nucleation and crystal growth in the amorphous material of the element of FIG. 1, as such rates vary according to the temperature at which the amorphous material is treated.

For the above values of $M_s$ and A, the critical radius $r_c$ for the crystalline particles is calculated as 192 Angstroms. The particles are to be formed of a size range such that most particles do not exceed the critical radius. In order to produce the desired array of particles without exceeding the desired size of particle while producing an adequate number to provide the desired magnetic bias, the crystal-formation step should be performed at a temperature that maximizes nucleation of crystals, but does not encourage crystal growth. This can be done because, as illustrated in FIG. 3, a temperature which corresponds to a peak rate of crystal nucleation is far from the temperature most conducive to crystal growth. In FIG. 3, curve 16 corresponds to the dependence of the rate of crystal nucleation on the heat-treatment temperature, while curve 18 shows the relation between the rate of crystal growth and the heat-treatment temperature. The heat treatment for a selected amorphous material should therefore be around the temperature T1 shown in FIG. 3, which corresponds to the peak of curve 16 and is far from the peak of curve 18. It should be understood that in FIG. 3 the end points of the horizontal scale are $T_{diff}$, a temperature below which atomic diffusion in the selected material occurs too slowly to be significant, and $T_m$, which is the melting temperature for the selected material.

It is believed that the effective mechanism by which the crystalline particles bias the amorphous matrix will be via exchange coupling rather than through the net magnetostatic field of the particles. The reason why magnetostatic coupling is not expected to be effective is schematically illustrated in FIG. 4.

Figure 4:
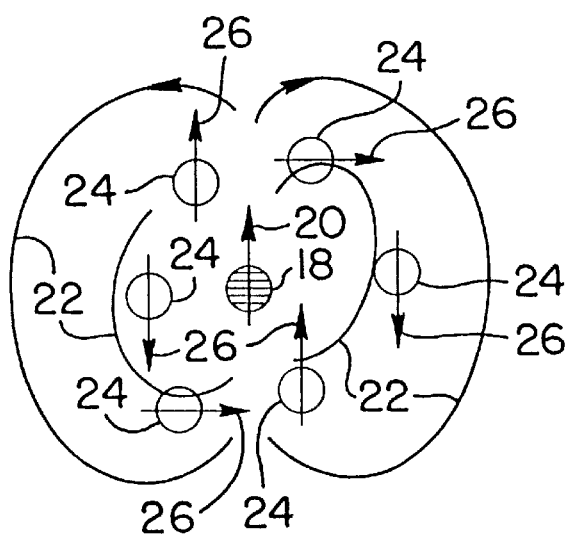
FIG. 4 is a schematic representation of how a magnetostatic field formed by a magnetized bias particle affects neighboring particles in the amorphous matrix.

FIG. 4 shows a crystalline particle 18 assumed to be magnetized in an upward direction, indicated by arrow 20. Lines of magnetic flux 22 are shown around magnetized particle 18. Under the influence of the field represented by the flux lines 22, particles 24 of the amorphous matrix surrounding the crystalline particle 18 are magnetically oriented in diverse directions, as indicated by arrows 26. Since the magnetostatic field provided by the particle 18 "loops back", the field provided by particle 18 fails to bias many of the surrounding amorphous matrix particles in the same direction of magnetic orientation.

In addition to selecting the temperature for crystallization treatment so as to encourage crystal nucleation more than crystal growth, nucleation can be further encouraged by adding copper, a known nucleation agent, to the alloy of which the magnetostrictive element is composed, while also adding niobium, which is known to retard growth of crystals.

As for further considerations entering into the selection of the composition of the alloy for element 10, it is noted that the alloy in amorphous form is to have soft magnetic characteristics, but should crystallize in a form that is relatively hard magnetically and provides an appreciable anisotropy. The crystal structure of the nucleated single-domain particles therefore should preferably be non-cubic. An appropriate candidate would be $(FeCo)_3B$, which has a body-centered tetragonal structure like $Fe_3C$ cementite. Since coercivity of single-domain particles increases substantially with particle diameter, it is believed that the $(FeCo)_3B$ crystals can be grown to a sufficient size to achieve coercivity in the desired range of 20–100 Oe.

Other considerations relating to selection of the alloy composition will be explained with reference to FIG. 5.

Figure 5:
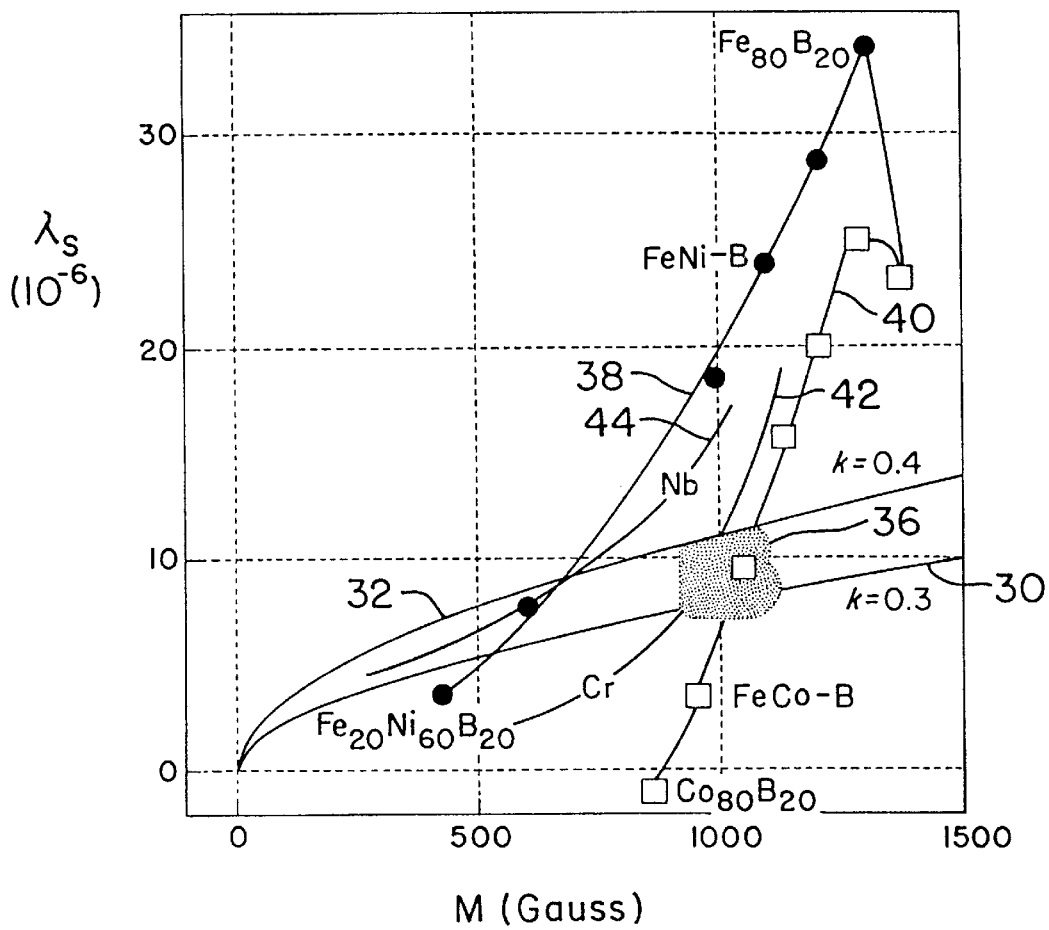
FIG. 5 presents characteristics in magnetostriction-magnetization space of various alloy compositions, as well as a preferred range of magnetostriction-magnetization characteristics.

FIG. 5 is a plot, in magnetostriction-magnetization space, of characteristics of a number of alloy compositions, along with plots of a preferred range of characteristics.

As discussed in co-pending U.S. patent application Ser. No. 08/800,771, entitled "Magnetostrictive Element Having Optimized Bias-Field-Dependent Resonant Frequency Characteristic", the amplitude of the ring-down signal provided by the active element in response to an interrogation signal pulse is optimized for values of a magnetomechanical coupling factor k in the range of about 0.3 to 0.4. For a given composition, and given levels of induced anisotropy and bias field, the coupling factor k increases with increasing magnetostriction, and decreases with increasing magnetization. Curves 30 and 32 in FIG. 5 plot combinations of magnetostriction and magnetization which correspond to levels of k=0.3 and 0.4, respectively. A shaded area 36 in FIG. 5 represents a desirable region of magnetostriction-magnetization characteristics between the curves 30 and 32 and near a desirable saturation magnetization of 1000 Gauss.

Curve 38 represents a range of iron-nickel-boron compositions with end points corresponding to $Fe_{80}B_{20}$ and $Fe_{20}Ni_{60}B_{20}$. It will be observed that curve 38 falls outside of the preferred region 36.

Curve 40 corresponds to a range of iron-cobalt-boron compositions, with end points corresponding to $Fe_{80}B_{20}$ and $Co_{80}B_{20}$. Curve 40 passes through the preferred region 36 at around $Fe_{20}Co_{60}B_{20}$. However, such a cobalt-rich composition is quite expensive and may not be suitable for formation of the desired crystalline particle biasing structure.

Curve 42 shows characteristics of a range of iron-chromium-boron compositions, corresponding to $Fe_{80-x}Cr_{3+x}B_{17}$, where $0 \leq x \leq 7$. It will be understood from curve 42 that adding a few percent chromium significantly reduces magnetostriction relative to $Fe_{80}B_{20}$ while causing only a modest reduction in magnetization.

Curve 44 represents a range of iron-niobium-boron compositions, corresponding to $Fe_{80-x}Nb_{3+x}B_{17}$, where $0 \leq x \leq 7$. Again it will be noted that the addition of a few percent of niobium significantly reduces the magnetostriction relative to $Fe_{80}B_{20}$, with only a modest reduction in magnetization. It will also be recalled that it is desired to include niobium in order to retard crystal growth.

Figure 7:
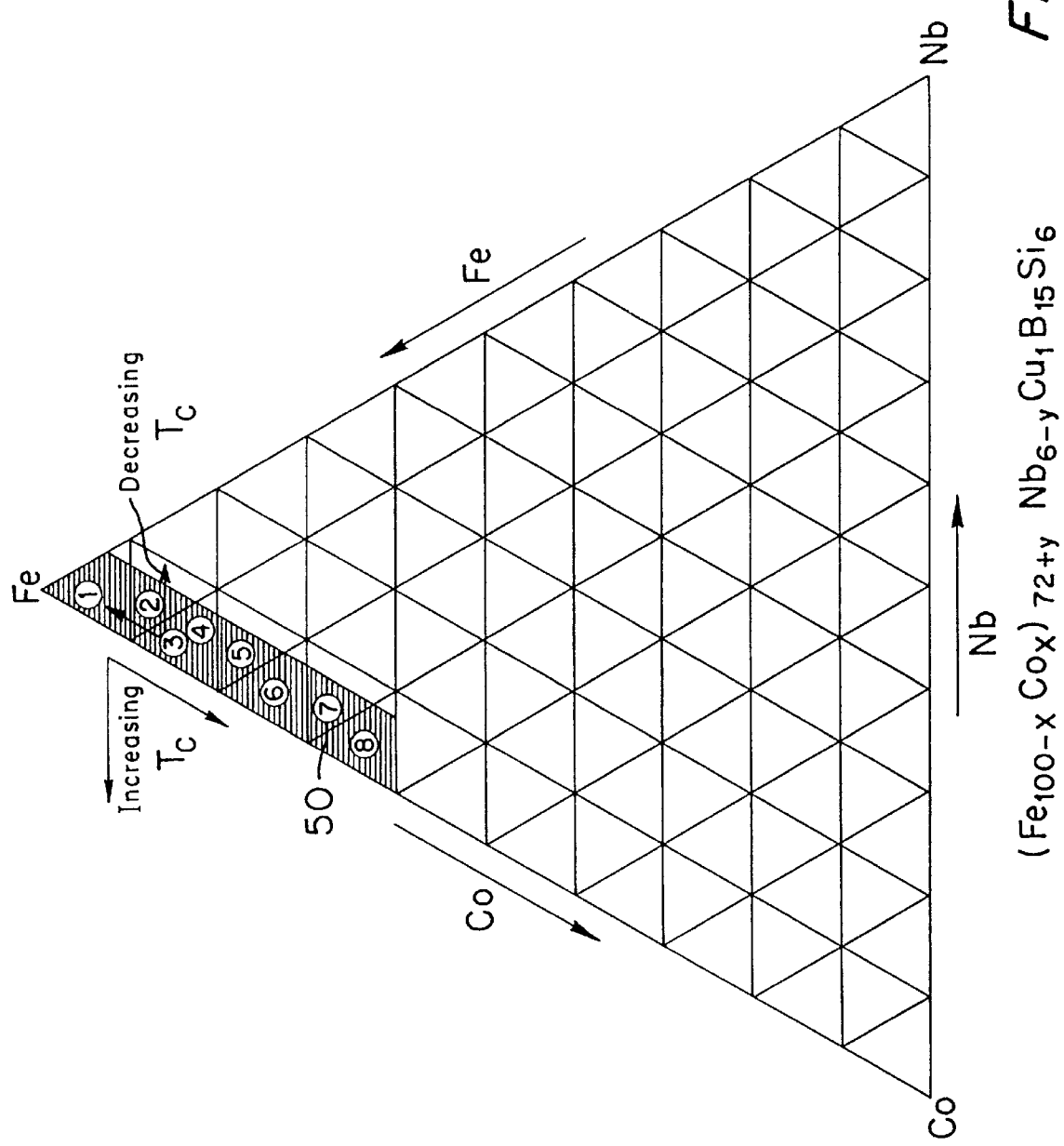
FIG. 7 is a ternary diagram illustrating a preferred range of iron-cobalt-niobium content for iron-cobalt-niobium-copper-boron-silicon amorphous alloys preferred for the self-biased magnetostrictive element of the present invention.

A preferred range of alloy compositions according to this invention is indicated by a shaded area 50 in FIG. 7. FIG. 7 is a ternary composition diagram for compositions according to the formula $(Fe_{100-x}Co_x)_{72+y}Nb_{6-y}Cu_1B_{15}Si_6$. The preferred range 50 corresponds to compositions consisting of $Fe_aCo_bNb_cCu_1B_{15}Si_6$, with $45 \leq a \leq 72$; $4 \leq b \leq 30$; $2 \leq c \leq 6$. Eight examples of compositions falling within the preferred range 50 are listed in Table 1 below. (It should be understood that all alloy compositions recited in this application and the appended claims are stated in terms of atomic percent.)

TABLE 1

| | COMPOSITION (atomic %) | | | | | | |
|---|---|---|---|---|---|---|---|
| Ex. | Fe | Co | Nb | Cu | B | Si | Tc(°C.) |
| 1 | 72 | 4 | 2 | 1 | 15 | 6 | 450 |
| 2 | 65 | 9 | 4 | 1 | 15 | 6 | 440 |
| 3 | 65 | 11 | 2 | 1 | 15 | 6 | 455 |
| 4 | 61 | 13 | 4 | 1 | 15 | 6 | 445 |
| 5 | 58 | 16 | 4 | 1 | 15 | 6 | 450 |
| 6 | 55.5 | 19.5 | 3 | 1 | 15 | 6 | 460 |
| 7 | 50 | 24 | 4 | 1 | 15 | 6 | 460 |
| 8 | 48 | 27 | 3 | 1 | 15 | 6 | 470 |

It is contemplated to vary this proposed range of compositions by adding a few percent of chromium and to vary the combined total of silicon and boron in the range of about 14 to 28% of the total of the composition. The ratio of silicon to boron may range from 0 to about one-third for the relatively iron-rich compositions, and may range from 0 to about 1.85 for relatively cobalt-rich compositions.

Including niobium and copper in the alloy tends to reduce the Curie temperature, which is the temperature at or above which annealing fails to produce magnetic-field-induced anisotropy. Reduction of the proportion of iron has the opposite effect, namely increasing the Curie temperature. Estimated Curie temperatures for the eight composition examples are listed in Table 1.

Figure 6:
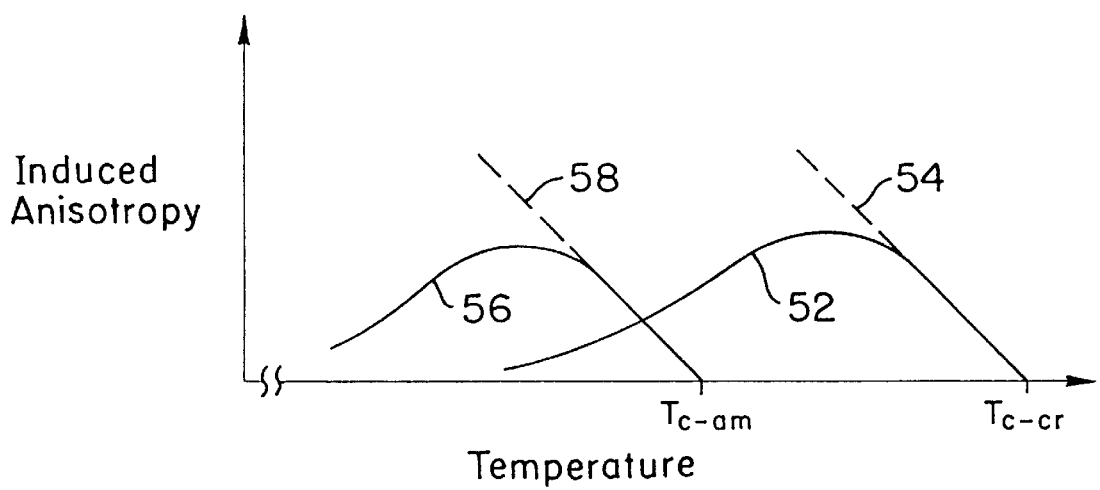
FIG. 6 is a graph indicating the relationship between the amount of induced anisotropy formed, respectively, in the amorphous bulk and in the crystalline bias particles, and the temperature at which heat treatment is performed.

According to the teachings of the present invention, nucleation of the desired bias particles is performed by heat-treatment in the presence of a magnetic field at a temperature above the Curie temperature for the amorphous alloy. The crystal nucleation treatment will therefore produce substantially no anisotropy in the amorphous bulk. Then a second treatment step is performed at a lower temperature which is below the Curie temperature of the amorphous alloy, sufficiently high to provide the atomic relaxation required to form a desired magnetic anisotropy in the amorphous bulk, yet low enough to have little or no effect on the crystalline particles. It is to be understood that the Curie temperature of the crystalline particles will be substantially above the Curie temperature for the amorphous alloy, as indicated in FIG. 6. In FIG. 6, $T_{c-cr}$ corresponds to the Curie temperature of the crystalline particles and $T_{c-am}$ corresponds to the Curie temperature of the amorphous alloy. Curve 52 corresponds to a degree of anisotropy induced in the crystalline particles for a given annealing time, according to variations in the annealing temperature. The line 54 corresponds to the maximum anisotropy that can be induced in the crystalline particles at a given temperature.

Similarly, curve 56 indicates the level of field-induced anisotropy achieved in the amorphous bulk for the given annealing time and according to variations in the annealing temperature. Line 58 corresponds to the maximum anisotropy that can be induced in the amorphous phase at a given temperature. For both the crystalline particles and the amorphous bulk, the annealing temperature must be high enough to cause an adequate amount of atomic relaxation if any level of anisotropy is to be achieved. The relaxation temperature for the crystalline particles is substantially higher than for the amorphous bulk.

For the specific composition listed as Example No. 4 in Table 1, i.e., $Fe_{61}Co_{13}Nb_4Cu_1B_{15}Si_6$, it is contemplated first to heat-treat the amorphous ribbon at about 450° C. with a DC magnetic field of about 100 Oe applied along the length of the amorphous ribbon. It is expected that less than five minutes of treatment under these conditions will be sufficient to nucleate single-domain crystalline particles with an anisotropy orientated along the length of the alloy ribbon. Since the crystal nucleation treatment is performed at a temperature above the Curie temperature of the amorphous material, substantially no anisotropy is induced in the amorphous bulk. The Curie temperature of the resulting crystalline particles will be greater than the 450° C. Crystallization of approximately 1% of the volume of the amorphous ribbon with longitudinal magnetization is expected to be adequate to provide exchange coupling bias in the longitudinal direction corresponding to about 10 Oe. The crystals would have a coercivity in the range of about 20–100 Oe. The resulting active element could therefore be deactivated by an alternating field with a peak amplitude of 100 Oe or less depending on the selected level of coercivity.

A second annealing step is performed for less than one minute in the presence of a saturating transverse magnetic field (e.g., 1000 Gauss) in a temperature range of about 300° to 400° C. The second annealing step is designed to induce a transverse anisotropy in the amorphous bulk at a level that substantially corresponds to the bias provided by the magnetized crystalline particles and with a coupling factor k in the preferred range of 0.3 to 0.4. The second annealing step is at a temperature that is sufficiently low that little or no relaxation occurs in the bias particles, so that the anisotropic condition of the bias particles is not significantly altered.

Although it is preferred that the effective bias level correspond to the level of transverse anisotropy, it is also contemplated to operate with a bias that is less than the transverse anisotropy if necessary to provide adequate output signal amplitude. In that case, the bias operating point would be below the "knee" of the M-H loop (FIG. 2A).

Self-biased magnetostrictive elements produced in accordance with the present invention may be used as magnetomechanical markers in conjunction with conventional magnetomechanical detecting equipment. The marker's housing structure may be simplified in comparison with conventional housing structures since no separate bias element is needed. Substantially the only requirements for the housing are that it secure the self-biasing magnetostrictive element to an article of merchandise without constraining the mechanical resonance of the magnetostrictive element which occurs upon exposure to an interrogation signal.

It should be noted that the terms soft, hard and semi-hard have been used in the above discussion to describe the magnetic properties of the materials employed in fabricating the markers of the invention. As used herein, the term soft magnetic material has been used to mean a magnetic material whose coercivity is below about 10 Oe, the term semi-hard magnetic material has been used to mean a magnetic material whose coercivity is above about 10 Oe and below about 500 Oe and the term hard magnetic material has been used to mean a magnetic material whose coercivity is above about 500 Oe.

Various changes in the above-disclosed embodiments and practices may be introduced without departing from the invention. The particularly preferred embodiments and practices of the invention are thus intended in an illustrative and not limiting sense. The true spirit and scope of the invention are set forth in the following claims.

What is claimed is:

1. A magnetomechanical electronic article surveillance system, comprising:

(a) generating means for generating an electromagnetic field alternating at a selected frequency in an interrogation zone, said generating means including an interrogation coil;

(b) a marker secured to an article appointed for passage through said interrogation zone, said marker including a strip of amorphous magnetostrictive metal alloy with crystalline magnetic particles distributed throughout the bulk of said amorphous alloy strip, said crystalline particles being magnetized to magnetically bias said amorphous metal alloy strip so that said strip magnetomechanically resonates when exposed to said alternating field; and (c) detecting means for detecting said magnetomechanical resonance of said magnetostrictive alloy strip.

2. A magnetostrictive element for use in a magnetomechanical electronic article surveillance marker, in the form of a strip of amorphous magnetically soft metal alloy, including particles of semi-hard or hard magnetic material distributed throughout the bulk of said alloy strip.

3. A magnetostrictive element according to claim 2, wherein said particles are crystals formed in said alloy strip by heat-treating said alloy strip.

4. A magnetostrictive element according to claim 2, wherein said particles have a coercivity of at least 20 Oe.

5. A magnetostrictive element according to claim 2, wherein said particles are magnetized to provide a bias magnetic field for the magnetostrictive element.

6. A magnetostrictive element according to claim 5, wherein each of said particles consists of a single magnetic domain.

7. A magnetostrictive element according to claim 2, wherein said alloy strip contains the chemical elements iron, cobalt, niobium, copper, boron and silicon.

8. A magnetostrictive element according to claim 7, wherein the proportions of copper, boron and silicon in said alloy strip are 1%, 15% and 6%, respectively, and the proportions of the others of said chemical elements are in the following ranges:

iron—45% to 72%, cobalt—4% to 30%, niobium—2% to 6%.

9. A marker for use in a magnetomechanical electronic article surveillance system, comprising:

a strip of magnetically soft amorphous metal alloy, including particles of semi-hard or hard magnetic material distributed throughout the bulk of said alloy strip.

10. A marker according to claim 9, wherein said particles are crystals formed in said alloy strip by heat-treating said alloy strip.

11. A marker according to claim 9, wherein said particles have a coercivity of at least 20 Oe.

12. A marker according to claim 9, wherein said particles are magnetized to provide a bias magnetic field for the magnetostrictive element.

13. A marker according to claim 12, wherein each of said particles consists of a single magnetic domain.

14. A marker according to claim 9, wherein said alloy strip contains the chemical elements iron, cobalt, niobium, copper, boron and silicon.

15. A marker according to claim 14, wherein the proportions of copper, boron and silicon in said alloy strip are 1%, 15% and 6%, respectively, and the proportions of the others of said chemical elements are in the following ranges:

iron—45% to 72%, cobalt—4% to 30%, niobium—2% to 6%.

16. A method of fabricating a marker for use in a magnetomechanical electronic article surveillance system, comprising the steps of:

first annealing a strip of amorphous magnetostrictive metal alloy having length and width extent during application of a first magnetic field directed along said length; and subsequent to said first annealing, second annealing said strip during application of a second magnetic field directed transverse to said length to form a transverse anisotropy in said strip.

17. A method according to claim 16, wherein said first annealing step is performed at a higher temperature than said second annealing step.

18. A method according to claim 17, wherein said first annealing step is performed at a temperature above a Curie temperature of said amorphous alloy and said second annealing step is performed at a temperature below said Curie temperature of said amorphous alloy.

19. A method according to claim 16, wherein said first annealing step is for forming a first magnetic structure in said alloy strip, and said second annealing step is performed so as not to substantially change said first magnetic structure.

20. A method according to claim 19, wherein said first magnetic structure consists of particles of semi-hard or hard magnetic material distributed throughout the bulk of said alloy strip.

21. A method according to claim 20, wherein each of said particles consists of a single magnetic domain.

22. A method according to claim 20, wherein said particles are crystals of semi-hard or hard magnetic material formed from said amorphous alloy during said first annealing step.

23. A method according to claim 22, wherein said first annealing step causes said particles to be magnetized in a direction substantially parallel to the length of said alloy strip to provide a bias magnetic field for said alloy strip.

24. A method of fabricating a marker for use in a magnetomechanical electronic article surveillance system comprising the steps of:

providing a strip of amorphous magnetostrictive metal alloy; and treating said alloy strip to form magnetized crystals distributed throughout the amorphous bulk of said strip and to form a magnetic anisotropy in the amorphous bulk of said strip.

25. A method according to claim 24, wherein each of said crystals consists of a single magnetic domain and all of said crystals are magnetized with an orientation substantially parallel to a longitudinal axis of said strip.

26. A method according to claim 25, wherein said magnetic anisotropy in the amorphous bulk of said strip is transverse to said longitudinal axis of said strip.

27. A method of fabricating a marker for use in a magnetomechanical electronic article surveillance system comprising the steps of:

first heat-treating a strip of magnetically soft, amorphous magnetostrictive metal alloy to form magnetically semi-hard or hard crystals distributed throughout the bulk of said alloy strip, each of said crystals consisting of a single magnetic domain; and second heat-treating said alloy strip at a temperature below a Curie temperature of said amorphous metal alloy to form a magnetic anisotropy in said bulk of said alloy strip.

28. A method according to claim 27, wherein said first heat-treating step is performed at a temperature above said Curie temperature of said amorphous metal alloy.

29. A method according to claim 27, wherein said amorphous metal alloy includes iron, cobalt, niobium, copper, boron and silicon.

30. A method according to claim 29, wherein said amorphous metal alloy has a composition consisting essentially of $Fe_aCo_bNb_cCu_1B_{15}Si_6$, with $45 \leq a \leq 72$; $4 \leq b \leq 30$; $2 \leq c \leq 6$.

31. A magnetostrictive element for use as an active element in a magnetomechanical electronic article surveillance marker, comprising a magnetostrictive alloy which has a composition consisting essentially of $Fe_aCo_bNb_cCu_1B_{15}Si_6$, with $45 \leq a \leq 72$; $4 \leq b \leq 30$; $2 \leq c \leq 6$.

32. A magnetomechanical EAS marker, comprising a strip of metal alloy which has a composition consisting essentially of $Fe_aCo_bNb_cCu_1B_{15}Si_6$, with $45 \leq a \leq 72$; $4 \leq b \leq 30$; $2 \leq c \leq 6$.

* * * * *